(12) United States Patent
Chiu et al.

(10) Patent No.: US 8,855,590 B2
(45) Date of Patent: Oct. 7, 2014

(54) RADIO FREQUENCY SIGNAL RECEIVING DEVICE

(71) Applicant: Montage Technology (Shanghai) Co., Ltd., Shanghai (CN)

(72) Inventors: Shih-Ming Chiu, Taipei Hsien (CN); Keng-Chang Liang, Taipei Hsien (CN)

(73) Assignee: Montage Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/753,006

(22) Filed: Jan. 29, 2013

(65) Prior Publication Data

US 2013/0273867 A1 Oct. 17, 2013

(30) Foreign Application Priority Data

Apr. 16, 2012 (TW) .............................. 101113482 A

(51) Int. Cl.
| | |
|---|---|
| *H04B 1/06* | (2006.01) |
| *H04B 1/10* | (2006.01) |
| *H03F 1/26* | (2006.01) |
| *H03F 3/45* | (2006.01) |

(52) U.S. Cl.
CPC ............ *H04B 1/10* (2013.01); *H03F 2200/294* (2013.01); *H03F 3/45* (2013.01); *H03F 1/26* (2013.01)
USPC ..................... 455/232.1; 455/252.1; 455/326; 455/341

(58) Field of Classification Search
CPC ........ H03F 1/26; H03F 3/45; H03F 2200/294
USPC ............. 455/326, 341, 232.1, 252.1; 330/301
See application file for complete search history.

(56) References Cited

U.S. PATENT DOCUMENTS

| | | | | |
|---|---|---|---|---|
| 6,057,714 | A * | 5/2000 | Andrys et al. ................ | 327/105 |
| 7,205,844 | B2 * | 4/2007 | Su et al. ........................ | 330/301 |
| 7,587,192 | B2 * | 9/2009 | Barre ............................ | 455/323 |
| 2002/0140520 | A1 * | 10/2002 | Hikita et al. .................. | 333/133 |
| 2004/0018823 | A1 * | 1/2004 | Yang et al. .................... | 455/296 |
| 2006/0103468 | A1 * | 5/2006 | Su et al. ........................ | 330/301 |
| 2007/0205829 | A1 * | 9/2007 | Kao et al. ...................... | 330/301 |
| 2008/0136528 | A1 * | 6/2008 | Sjoland ......................... | 330/301 |
| 2010/0041361 | A1 * | 2/2010 | Ojo ............................... | 455/334 |
| 2010/0259319 | A1 * | 10/2010 | Chan et al. .................... | 327/563 |
| 2010/0308914 | A1 * | 12/2010 | Kuo et al. ..................... | 330/261 |

* cited by examiner

*Primary Examiner* — Duc M Nguyen
(74) *Attorney, Agent, or Firm* — Oliff PLC

(57) ABSTRACT

Disclosed is a radio frequency signal receiving device, which includes a low-noise amplifier (LNA) and a mixer. The LNA includes a first inductor and a second inductor. The mixer has a first differential pair and a second differential pair, common ends of the first differential pair and the second differential pair are respectively coupled to the first differential output end and the second differential output end. The first inductor and the second inductor are serially connected between the first differential output end and the second differential output end of the LNA, so as to reduce power consumption and reach suitable frequency response. The first inductor and the second inductor generate a resonance effect with parasitic capacitance on the mixer, so as to effectively reduce flicker noises, and improve a working benefit of the radio frequency signal receiving device.

9 Claims, 2 Drawing Sheets

RADIO FREQUENCY SIGNAL RECEIVING DEVICE

BACKGROUND OF THE PRESENT INVENTION

1. Field of Invention

The present invention relates to a radio frequency signal receiving device.

2. Description of Related Arts

In the field of wired communications and wireless communications, so-called broadband communication technologies are proposed in succession, for example, digital video broadcasting-handheld (DVB-H) (470-890 MHz) and cognitive radio (0.1-10 GHz). A low-noise amplifier (LNA) is configured in a first level circuit of a receiving device, so that characteristics of the LNA may directly affect entire performance of the receiving device. Therefore, in consideration of the broadband performance, designers may face more challenges, which include how to design an LNA with broadband input matching, gain bandwidth, and low power consumption.

A mixer is a second level circuit of the receiving device. In design of the mixer, the designers need to consider the power consumption of the mixer, and the area of the circuit, and further need to consider flicker noises generated during the combination action of the LNA and the mixer.

SUMMARY OF THE PRESENT INVENTION

An object of the present invention is to provide a radio frequency signal receiving device, so as to solve the problems of the prior art.

In order to accomplish the above and other related objects, the radio frequency signal receiving device provided in the present invention comprises an LNA and a mixer. The LNA has a single input end, a first differential output end, and a second differential output end. The single input end receives a radio frequency input signal. The LNA comprises: a first inductor, serially connected between the first differential output end and an operating voltage receiving end; and a second inductor, serially connected between the second differential output end and the operating voltage receiving end. The mixer is coupled to the first differential output end and the second differential output end of the LNA, and has a first differential pair and a second differential pair. Common ends of the first differential pair and the second differential pair are respectively coupled to the first differential output end and the second differential output end, and the first differential pair and the second differential pair commonly receive a differential signal group.

In an embodiment of the present invention, the LNA comprises an inverting amplifier circuit and a single-end to dual-end amplifier circuit. An input end of the inverting amplifier circuit is coupled to the single input end. The single-end to dual-end amplifier circuit is coupled to an output end of the inverting amplifier circuit, and coupled to the first differential output end and the second differential output end.

In an embodiment of the present invention, the inverting amplifier circuit comprises: a first transistor, a second transistor, and a first capacitor. The first transistor has a first end, a second end, and a control end. The first end is coupled to the operating voltage receiving end, and the second end is coupled to the output end of the inverting amplifier circuit. The second transistor has a first end, a second end, and a control end. The control end is coupled to the control end of the first transistor, the first end of the second transistor is coupled to the second end of the first transistor, and the second end of the second transistor is coupled to a grounding voltage end. The first capacitor is serially connected between the single input end and the control ends of the first transistor and the second transistor.

In an embodiment of the present invention, the first inductor and the second inductor are disposed in the single-end to dual-end amplifier circuit, and the single-end to dual-end amplifier circuit further comprises: a third transistor, a fourth transistor, a fifth transistor, a sixth transistor, and a second capacitor. The third transistor has a first end, a second end, and a control end. The control end is coupled to a constant voltage end, and the first end is coupled to the first differential output end. The fourth transistor has a first end, a second end, and a control end. The control end is coupled to the second end of the third transistor, and the first end of the fourth transistor is coupled to the second differential output end. The fifth transistor has a first end, a second end, and a control end. The control end is coupled to the output end of the inverting amplifier circuit, and the first end of the fifth transistor is coupled to the second end of the third transistor. The sixth transistor has a first end, a second end, and a control end. The control end is coupled to the constant voltage end, the first end of the sixth transistor is coupled to the second end of the fourth transistor, and the second end of the sixth transistor is coupled to the grounding voltage end. The second capacitor is coupled between a coupling end point of the third transistor and the fifth transistor and the control end of the fourth transistor.

In an embodiment of the present invention, the single-end to dual-end amplifier circuit further comprises a third capacitor, serially connected between the control end of the third transistor and the grounding voltage end, or serially connected between the control end of the third transistor and the operating voltage receiving end.

In an embodiment of the present invention, the single-end to dual-end amplifier circuit further comprises a fourth capacitor, serially connected between a coupling end point of the fourth transistor and the sixth transistor and the grounding voltage end, or serially connected between a coupling end point of the fourth transistor and the sixth transistor and the operating voltage receiving end.

In an embodiment of the present invention, the first differential pair of the mixer comprises a first differential transistor and a second differential transistor. The first differential transistor has a first end, a second end, and a control end. The control end receives a first signal of the differential signal group, the first end of the first differential transistor is coupled to the first differential output end, and the second end of the first differential transistor is coupled to the first mixing output end. The second differential transistor has a first end, a second end, and a control end. The control end receives a second signal of the differential signal group, the first end of the second differential transistor is coupled to the first differential output end, and the second end of the second differential transistor is coupled to the second mixing output end. The second differential pair of the mixer comprises: a third differential transistor and a fourth differential transistor. The third differential transistor has a first end, a second end, and a control end. The control end receives the second signal of the differential signal group, the first end of the third differential transistor is coupled to the second differential output end, and the second end of the third differential transistor is coupled to the first mixing output end. The fourth differential transistor has a first end, a second end, and a control end. The control end receives the first signal of the differential signal group, the first end of the fourth differential transistor is coupled to the second differential output end, and the second end of the fourth differential transistor is coupled to the second mixing output end.

In an embodiment of the present invention, the mixer further comprises a first load and a second load. The first load is coupled between the first mixing output end and a grounding voltage end; and the second load is coupled between the second mixing output end and the grounding voltage end.

In an embodiment of the present invention, the first load comprises a fifth capacitor and a first resistor. The fifth capacitor is coupled between the first mixing output end and the grounding voltage end; and a first resistor is coupled to the fifth capacitor in parallel.

In an embodiment of the present invention, the second load comprises a sixth capacitor and a second resistor. The sixth capacitor is coupled between the second mixing output end and the grounding voltage end; and the second resistor is coupled to the sixth capacitor in parallel.

As described above, in the radio frequency signal receiving device according to the present invention, the first inductor and the second inductor are serially connected between the first differential output end and the second differential output end of the LNA, so as to reduce power consumption and reach suitable frequency response. The first inductor and the second inductor generate a resonance effect with parasitic capacitance on the mixer, so as to effectively reduce flicker noises, and improve a working benefit of the radio frequency signal receiving device.

Figure 1:
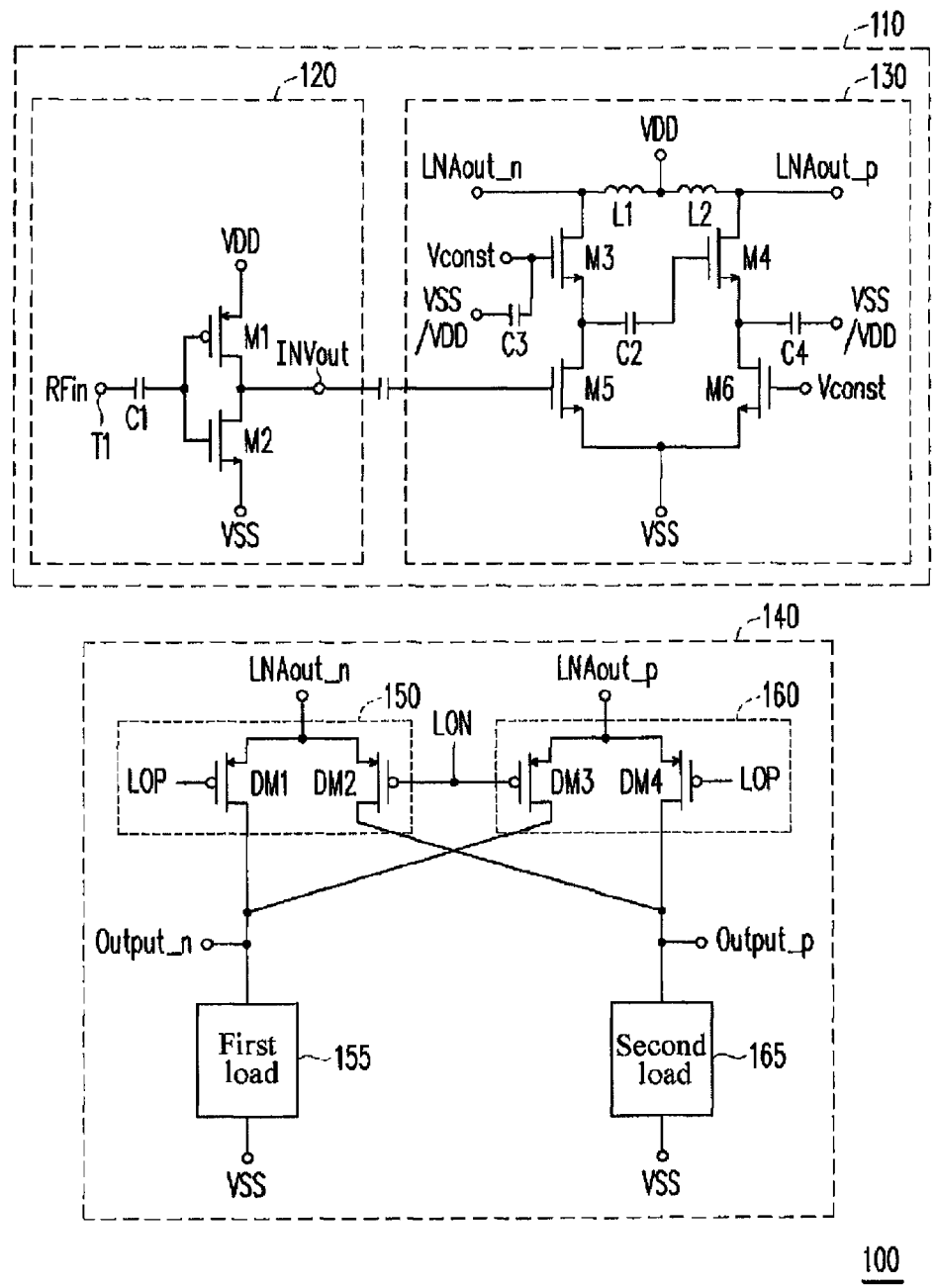
FIG. 1 is a circuit diagram of a radio frequency signal receiving device according to an embodiment of the present invention.

LIST OF REFERENCE NUMERALS 100, 200 Radio frequency signal receiving device
110 LNA
120 Inverting amplifier circuit
130 Single-end to dual-end amplifier circuit
140 Mixer
150 First differential pair
155 First load
160 Second differential pair
165 Second load
C1 First capacitor
C2 Second capacitor
C3 Third capacitor
C4 Fourth capacitor
C5 Fifth capacitor
C6 Sixth capacitor
DM1 First differential transistor
DM2 Second differential transistor
DM3 Third differential transistor
DM4 Fourth differential transistor
INVout Output end of inverting amplifier circuit
LNAout_n First differential output end
LNAout_p Second differential output end
LOP First signal of differential signal group
LON Second signal of differential signal group
L1 First inductor
L2 Second inductor
M1 First transistor
M2 Second transistor
M3 Third transistor
M4 Fourth transistor
M5 Fifth transistor
M6 Sixth transistor
Output_n First mixing output end
Output_p Second mixing output end
RFin Radio frequency input signal
R1 First resistor
R2 Second resistor
T1 Single input end
Vconst Constant voltage end
VDD Operating voltage receiving end
VSS Grounding voltage end

DETAILED DESCRIPTION OF THE PREFERRED EMBODIMENTS

Examples of embodiments are described in the accompanying drawings with reference to the embodiments of the present invention in detail. In addition, in possible positions, components/members with the same numerals are used in the drawings and embodiments to represent the same or similar parts.

FIG. 1 is a circuit diagram of a radio frequency signal receiving device according to an embodiment of the present invention. Referring to FIG. 1, the radio frequency signal receiving device 100 includes an LNA 110 and a mixer 140. The LNA 110 has a single input end T1, a first differential output end LNAout_n, and a second differential output end LNAout_p. Further, the LNA 110 has the single input end T1 for receiving a radio frequency input signal RFin, and the LNA 110 includes a first inductor L1 and a second inductor L2. The first inductor L1 is serially connected between the first differential output end LNAout_n and an operating voltage receiving end VDD. The second inductor L2 is serially connected between the second differential output end LNAout_p and the operating voltage receiving end VDD. The mixer 140 is coupled to the first differential output end LNAout_n and the second differential output end LNAout_p of the LNA 110. The mixer 140 has a first differential pair 150 and a second differential pair 160. Common ends of the first differential pair 150 and the second differential pair 160 are respectively coupled to the first differential output end LNAout_n and the second differential output end LNAout_p. The first differential pair 150 and the second differential pair 160 commonly receive a differential signal group, in which the differential signal group includes a first signal LOP and a second signal LON.

More clearly, the LNA 110 includes an inverting amplifier circuit 120 and a single-end to dual-end amplifier circuit 130. An input end of the inverting amplifier circuit 120 is coupled to the single input end T1. The single-end to dual-end amplifier circuit 130 is coupled to an output end INVout of the inverting amplifier circuit 120, and is coupled to the first differential output end LNAout_n and the second differential output end LNAout_p.

Further, the inverting amplifier circuit 120 includes a first transistor M1, a second transistor M2, and a first capacitor C1. The first transistor M1 and the second transistor M2 respectively have a first end, a second end, and a control end. The first end of the first transistor M1 is coupled to the operating voltage receiving end VDD. The second end of the first transistor M1 is coupled to the output end INVout of the inverting amplifier circuit 120. The control end of the second transistor M2 is coupled to the control end of the first transistor M1. The first end of the second transistor M2 is coupled to the second end of the first transistor M1. The second end of the second transistor M2 is coupled to a grounding voltage end VSS. The first capacitor C1 is serially connected between the single input end T1, and the control ends of the first transistor M1 and the second transistor M2, in which the capacitor C1 may filter a direct current (DC) component of the radio frequency input signal RFin.

In this embodiment, the first inductor L1 and the second inductor L2 are disposed in the single-end to dual-end amplifier circuit 130. The single-end to dual-end amplifier circuit 130 further includes a third transistor M3, a fourth transistor M4, a fifth transistor M5, a sixth transistor M6, and a second capacitor C2. The third to the sixth transistors M3-M6 respectively have a first end, a second end, and a control end. The control end of the third transistor M3 is coupled to a constant voltage end Vconst. It should be noted that a voltage supplied by the constant voltage end Vconst is not a zero voltage (grounding voltage). The first end of the third transistor M3 is coupled to the first differential output end LNAout_n. The control end of the fourth transistor M4 is coupled to the second end of the third transistor M3. The first end of the fourth transistor M4 is coupled to the second differential output end LNAout_p. The control end of the fifth transistor M5 is coupled to the output end INVout of the inverting amplifier circuit 120. The first end of the fifth transistor M5 is coupled to the second end of the third transistor M3. The control end of the sixth transistor M6 is coupled to the constant voltage end Vconst. The first end of the sixth transistor M6 is coupled to the second end of the fourth transistor M4. The second end of the sixth transistor M6 is coupled to the grounding voltage end VSS. The second capacitor C2 is coupled between a coupling end point of the third transistor M3 and the fifth transistor M5 and the control end of the fourth transistor M4.

In addition, the single-end to dual-end amplifier circuit 130 further includes a third capacitor C3 and a fourth capacitor C4. The third capacitor C3 is serially connected between the control end of the third transistor M3 and the grounding voltage end VSS, or the third capacitor C3 is serially connected between the control end of the third transistor M3 and the operating voltage receiving end VDD; and the fourth capacitor C4 is serially connected between a coupling end point of the fourth transistor M4 and the sixth transistor M6 and the constant voltage end VSS, or the fourth capacitor C4 is serially connected between the coupling end point of the fourth transistor M4 and the sixth transistor M6 and the operating voltage receiving end VDD.

Here, a detailed circuit of the mixer 140 is described. The first differential pair 150 of the mixer 140 includes a first differential transistor DM1 and a second differential transistor DM2. The first differential transistor DM1 and the second differential transistor DM2 respectively have a first end, a second end, and a control end. The control end of the first differential transistor DM1 receives the first signal LOP of the differential signal group. The first end of the first differential transistor DM1 is coupled to the first differential output end LNAout_n. The second end of the first differential transistor DM1 is coupled to the first mixing output end Output_n. The control end of the second differential transistor DM2 receives the second signal LON of the differential signal group. The first end of the second differential transistor DM2 is coupled to the first differential output end LNAout_n. The second end of the second differential transistor DM2 is coupled to the second mixing output end Output_p, in which the first signal LOP and the second signal LON are differential signals for each other. In this embodiment, the first signal LOP and the second signal LON are signals with complementary phases.

The second differential pair 160 of the mixer 140 includes a third differential transistor DM3 and a fourth differential transistor DM4. The third differential transistor DM3 and the fourth differential transistor DM4 respectively have a first end, a second end, and a control end. The control end of the third differential transistor DM3 receives the second signal LON of the differential signal group. The first end of the third differential transistor DM3 is coupled to the second differential output end LNAout_p. The second end of the third differential transistor DM3 is coupled to the first mixing output end Output_n. The control end of the fourth differential transistor DM4 receives the first signal LOP of the differential signal group. The first end of the fourth differential transistor DM4 is coupled to the second differential output end LNAout_p. The second end of the fourth differential transistor DM4 is coupled to the second mixing output end Output_p.

In this embodiment, the mixer 140 further includes a first load 155 and a second load 165. The first load 155 is coupled between the first mixing output end Output_n and the grounding voltage end VSS. The second load 165 is coupled between the second mixing output end Output_p and the grounding voltage end VSS.

Figure 2:
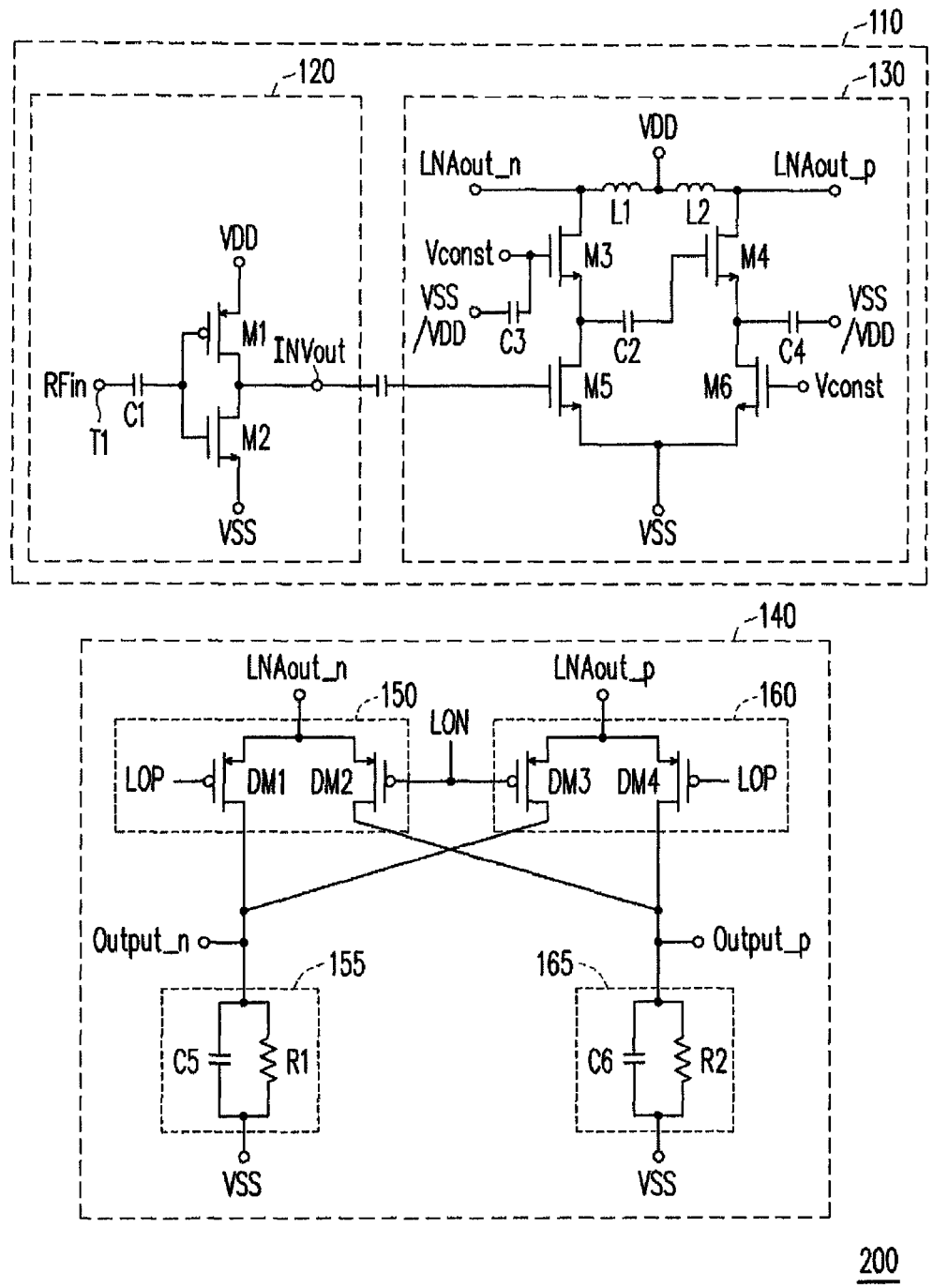
FIG. 2 is a circuit diagram of a radio frequency signal receiving device according to another embodiment of the present invention.

FIG. 2 is a circuit diagram of a radio frequency signal receiving device according to another embodiment of the present invention. Referring to FIG. 2, architecture of the radio frequency signal receiving device 200 is basically the same as the radio frequency signal receiving device 100, except that the first load 155 may include a fifth capacitor C5 and a first resistor R1, and the second load 165 includes a sixth capacitor C6 and a second resistor R2. The fifth capacitor C5 is coupled between the first mixing output end Output_n and the grounding voltage end VSS, and the first resistor R1 is in parallel with the fifth capacitor C5. Similarly, the sixth capacitor C6 is coupled between the second mixing output end Output_p and the grounding voltage end VSS, and the second resistor R2 is in parallel with the sixth capacitor C6.

It should be noted that in the embodiment of the present invention, the first inductor L1 is coupled to the common end of the first differential pair 150 through the first differential output end LNAout_n, and the second inductor L2 is coupled to the common end of the second differential pair 160 through the second differential output end LNAout_p. That is to say, the LNA 110 and the mixer 140 are connected through a so-called DC coupled manner, in this manner, a capacitor component is not required between the LNA 110 and the mixer 140. Further, through parasitic capacitance between the LNA 110 and the mixer 140, and with a resonance action between the first inductor L1 and the second inductor L2, flicker noises may be effectively reduced, and performance of the radio frequency signal receiving device may be improved.

In addition, the mixer 140 of the embodiment of the present invention is constructed by using a Gilbert-cell mixer circuit architecture, which has lower power consumption and high linearity. The mixer 140 may provide basic gain to compress the noise.

To sum up, in the present invention, the LNA is connected to the mixer in the DC coupling manner. Through resonance of the inductor on the LNA and the parasitic capacitance on the mixer, the flicker noises may be effectively reduced. In the present invention, an entity capacitor is not required to be disposed between the LNA and the mixer, so as to effectively reduce the area of the circuit. In the present invention, a voltage to current converter is not required to be configured in the mixer, so as to effectively reduce limit of the linearity and the power consumption.

The above description of the detailed embodiments are only to illustrate the preferred implementation according to the present invention, and it is not to limit the scope of the present invention, Accordingly, all modifications and variations completed by those with ordinary skill in the art should fall within the scope of the present invention defined by the appended claims.

What is claimed is:

1. A radio frequency signal receiving device, comprising:
a low-noise amplifier (LNA), having a single input end, a first differential output end, and a second differential output end, wherein the single input end receives a radio frequency input signal, and the LNA comprising:
 a first inductor, serially connected between the first differential output end and an operating voltage receiving end;
 a second inductor, serially connected between the second differential output end and the operating voltage receiving end;
 an inverting amplifier circuit, wherein an input end of the inverting amplifier circuit is coupled to the single input end; and
 a single-end to dual-end amplifier circuit, coupled to an output end of the inverting amplifier circuit, and coupled to the first differential output end and the second differential output end; and
a mixer, coupled to the first differential output end and the second differential output end of the LNA, and having a first differential pair and a second differential pair, wherein common ends of the first differential pair and the second differential pair are respectively coupled to the first differential output end and the second differential output end, and the first differential pair and the second differential pair commonly receive a differential signal group.

2. The radio frequency signal receiving device as in claim 1, wherein the inverting amplifier circuit comprises:
 a first transistor, having a first end, a second end, and a control end, wherein the first end is coupled to the operating voltage receiving end, and the second end is coupled to the output end of the inverting amplifier circuit;
 a second transistor, having a first end, a second end, and a control end, wherein the control end is coupled to the control end of the first transistor, the first end of the second transistor is coupled to the second end of the first transistor, and the second end of the second transistor is coupled to a grounding voltage end; and
 a first capacitor, serially connected between the single input end and the control ends of the first transistor and the second transistor.

3. The radio frequency signal receiving device as in claim 1, wherein the first inductor and the second inductor are disposed in the single-end to dual-end amplifier circuit, and the single-end to dual-end amplifier circuit further comprises:
 a third transistor, having a first end, a second end, and a control end, wherein the control end is coupled to a constant voltage end, and the first end is coupled to the first differential output end;
 a fourth transistor, having a first end, a second end, and a control end, wherein the control end is coupled to the second end of the third transistor, and the first end of the fourth transistor is coupled to the second differential output end;
 a fifth transistor, having a first end, a second end, and a control end, wherein the control end is coupled to the output end of the inverting amplifier circuit, and the first end of the fifth transistor is coupled to the second end of the third transistor;
 a sixth transistor, having a first end, a second end, and a control end, wherein the control end is coupled to the constant voltage end, the first end of the sixth transistor is coupled to the second end of the fourth transistor, and the second end of the sixth transistor is coupled to the grounding voltage end; and
 a second capacitor, coupled between a coupling end point of the third transistor and the fifth transistor and the control end of the fourth transistor.

4. The radio frequency signal receiving device as in claim 3, wherein the single-end to dual-end amplifier circuit further comprises:
 a third capacitor, serially connected between the control end of the third transistor and the grounding voltage end, or serially connected between the control end of the third transistor and the operating voltage receiving end.

5. The radio frequency signal receiving device as in claim 3, wherein the single-end to dual-end amplifier circuit further comprises:
 a fourth capacitor, serially connected between a coupling end point of the fourth transistor and the sixth transistor and the grounding voltage end, or serially connected between a coupling end point of the fourth transistor and the sixth transistor and the operating voltage receiving end.

6. The radio frequency signal receiving device as in claim 1, wherein the first differential pair of the mixer comprises:
 a first differential transistor, having a first end, a second end, and a control end, wherein the control end receives a first signal of the differential signal group, the first end of the first differential transistor is coupled to the first differential output end, and the second end of the first differential transistor is coupled to a first mixing output end; and
 a second differential transistor, having a first end, a second end, and a control end, wherein the control end receives a second signal of the differential signal group, the first end of the second differential transistor is coupled to the first differential output end, and the second end of the second differential transistor is coupled to a second mixing output end; and
the second differential pair of the mixer comprises:
 a third differential transistor, having a first end, a second end, and a control end, wherein the control end receives the second signal of the differential signal group, the first end of the third differential transistor is coupled to the second differential output end, and the second end of the third differential transistor is coupled to the first mixing output end; and
 a fourth differential transistor, having a first end, a second end, and a control end, wherein the control end receives the first signal of the differential signal group, the first end of the fourth differential transistor is coupled to the second differential output end, and the second end of the fourth differential transistor is coupled to the second mixing output end.

7. The radio frequency signal receiving device as in claim 6, wherein the mixer further comprises:
 a first load, coupled between the first mixing output end and the grounding voltage end; and
 a second load, coupled between the second mixing output end and the grounding voltage end.

8. The radio frequency signal receiving device as in claim 7, wherein the first load comprises:

a fifth capacitor, coupled between the first mixing output end and the grounding voltage end; and
a first resistor, coupled to the fifth capacitor in parallel.

9. The radio frequency signal receiving device as in claim 7, wherein the second load comprises:
a sixth capacitor, coupled between the second mixing output end and the grounding voltage end; and
a second resistor, coupled to the sixth capacitor in parallel.

* * * * *